United States Patent
Zang et al.

(10) Patent No.: US 9,768,196 B2
(45) Date of Patent: Sep. 19, 2017

(54) FLEXIBLE DISPLAY APPARATUS, FLEXIBLE DISPLAY MOTHERBOARD AND METHOD FOR MANUFACTURING FLEXIBLE DISPLAY MOTHERBOARD

(71) Applicants: Shanghai Tianma Micro-Electronics Co., Ltd., Shanghai (CN); Tianma Micro-Electronics Co., Ltd., Shenzhen (CN)

(72) Inventors: Haochun Zang, Shanghai (CN); Zhengzhong Chen, Shanghai (CN); Sitao Huo, Shanghai (CN)

(73) Assignees: SHANGHAI TIANMA MICRO-ELECTRONICS CO., LTD., Shanghai (CN); TIANMA MICRO-ELECTRONICS CO., LTD., Shenzhen (CN)

( * ) Notice: Subject to any disclaimer, the term of this patent is extended or adjusted under 35 U.S.C. 154(b) by 0 days.

(21) Appl. No.: 14/595,185

(22) Filed: Jan. 12, 2015

(65) Prior Publication Data

US 2016/0029473 A1 Jan. 28, 2016

(30) Foreign Application Priority Data

Jul. 24, 2014 (CN) .......................... 2014 1 0356689

(51) Int. Cl.
| | | |
|---|---|---|
| *H01L 27/12* | (2006.01) | |
| *H05K 1/02* | (2006.01) | |
| *H05K 3/00* | (2006.01) | |

(52) U.S. Cl.
CPC .... *H01L 27/1218* (2013.01); *B32B 2457/202* (2013.01); *H05K 1/028* (2013.01); *H05K 3/0017* (2013.01)

(58) Field of Classification Search
None
See application file for complete search history.

(56) References Cited

U.S. PATENT DOCUMENTS

| | | | | |
|---|---|---|---|---|
| 2003/0222334 A1* | 12/2003 | Ikeda | .................. | G02F 1/13454 257/678 |
| 2004/0029317 A1* | 2/2004 | Tokushige | .......... | H01L 21/6835 438/118 |
| 2005/0175831 A1* | 8/2005 | Kim | ........................ | B32B 33/00 428/323 |
| 2006/0046352 A1* | 3/2006 | Low | ...................... | H01L 21/563 438/127 |
| 2009/0166635 A1* | 7/2009 | Kim | .................... | H01L 27/1218 257/59 |
| 2010/0015443 A1* | 1/2010 | Yasuda | .............. | C08G 65/2609 428/355 N |
| 2010/0193912 A1* | 8/2010 | Speakman | ................ | G03F 1/56 257/618 |
| 2014/0097429 A1* | 4/2014 | Kim | .................... | H01L 27/1262 257/48 |

FOREIGN PATENT DOCUMENTS

TW    I306364 B    2/2009

* cited by examiner

*Primary Examiner* — Anthony J Frost
(74) *Attorney, Agent, or Firm* — Alston & Bird LLP

(57) ABSTRACT

A flexible display motherboard is disclosed. The motherboard includes a first group of flexible display units, where the first group includes at least one flexible display unit. The motherboard also includes a second group of flexible display units, where the second group includes at least one flexible display unit. The motherboard also includes one or more first grooves between the first and second groups.

17 Claims, 7 Drawing Sheets

FLEXIBLE DISPLAY APPARATUS, FLEXIBLE DISPLAY MOTHERBOARD AND METHOD FOR MANUFACTURING FLEXIBLE DISPLAY MOTHERBOARD

CROSS-REFERENCES TO RELATED APPLICATIONS

This application claims the benefit of priority to Chinese Patent Application No. 201410356689.1, filed with the Chinese Patent Office on Jul. 24, 2014 and entitled "FLEXIBLE DISPLAY APPARATUS, FLEXIBLE DISPLAY MOTHERBOARD AND METHOD FOR MANUFACTURING FLEXIBLE DISPLAY MOTHERBOARD", the content of which is incorporated herein by reference in its entirety.

BACKGROUND OF THE INVENTION

The flexible display, which is light, impact resistant, flexible, wearable and portable, stands out from conventional display apparatuses and represents a new and prospective display technology.

To manufacture the flexible display, the major technical bottleneck is how to provide a display device such as the Thin Film Transistor (TFT) on a flexible plastic substrate instead of a glass substrate. FIGS. 1a-1c illustrate main processes of a conventional technology for manufacturing the flexible display, with which the aforementioned technical bottleneck is solved. Firstly, a flexible substrate 20 is adhered to a glass substrate 10 by using an organic temporary-adhesive material, or the flexible substrate 20 may be directly coated on the glass substrate 10; then, a display device 30 such as the TFT is provided on the flexible substrate 20; and finally, the flexible substrate 20 is separated from the glass substrate 10, to form a flexible display motherboard.

Generally, the flexible substrate 20 is a plastic substrate. Before providing the display device 30 such as the TFT, a buffer layer 21 is further required to be deposited on a surface of the flexible substrate 20, to ensure good moisture isolation of the flexible substrate 20 during subsequent processes performed under high temperature.

Inward shrinkage stress may be accumulated within the flexible display motherboard during making film layers such as the buffer layer, which may result in inward shrink and warpage of the flexible substrate, thereby influencing manufacture of the flexible display motherboard and performance of a flexible display apparatus.

BRIEF SUMMARY OF THE INVENTION

One inventive aspect is a flexible display motherboard. The motherboard includes a first group of flexible display units, where the first group includes at least one flexible display unit. The motherboard also includes a second group of flexible display units, where the second group includes at least one flexible display unit. The motherboard also includes one or more first grooves between the first and second groups.

Another inventive aspect is a flexible display apparatus. The display apparatus includes a plurality of flexible display units diced from a flexible display motherboard, where the flexible display motherboard includes a first group of flexible display units. The first group includes at least one flexible display unit. The motherboard also includes a second group of flexible display units, where the second group includes at least one flexible display unit, and one or more first grooves between the first and second groups.

Another inventive aspect is a method of manufacturing a flexible display motherboard. The method includes forming a first group of flexible display units, where the first group includes at least one flexible display unit, and forming a second group of flexible display units, where the second group includes at least one flexible display unit. The method also includes forming one or more first grooves between the first and second groups.

BRIEF DESCRIPTION OF THE DRAWINGS

To clarify a technical solution according to embodiments of the disclosure and conventional technologies, drawings to be used in the following description of the embodiments are briefly introduced hereinafter. Apparently, the drawings in the following description are merely exemplary, and other drawings may be obtained by the ordinary skilled in the art based on the drawings without creative works.

DETAILED DESCRIPTION OF THE PREFERRED EMBODIMENTS

As described in the background, the inward shrinkage stress with the film layers of the conventional flexible display motherboard may result in an inward shrink and a warpage of the flexible substrate, thereby affecting the manufacture of the flexible display motherboard and performance of the flexible display apparatus.

Accordingly, a flexible display motherboard is provided in the disclosure to overcome the above disadvantages of conventional technologies. The flexible display motherboard includes a plurality of flexible display units which are divided into several groups, and each group includes at least one flexible display unit. First grooves are provided between the groups of flexible display units.

A flexible display apparatus is further provided in the disclosure, which includes flexible display units obtained by dicing the flexible display motherboard described above.

With the flexible display apparatus, the flexible display motherboard and the method for manufacturing the flexible display motherboard provided in the disclosure, the flexible display motherboard includes a plurality of flexible display units which are divided into several groups, each group includes at least one flexible display unit, and first grooves are provided between the groups of flexible display units. The inward shrinkage stress within the flexible display motherboard may be released via the first grooves. Hence, an accumulation of the inward shrinkage stress, which may affect the manufacture of the flexible display motherboard and may result in a failure of the flexible display apparatus, is avoided effectively.

The principle of the disclosure is described hereinabove. Embodiments of the disclosure are detailed hereinafter in conjunction with drawings, to further clarify objects, features and advantages of the disclosure.

Although many details are given in the following description for better understanding the disclosure, the disclosure may be implemented with other embodiments different from those described herein. Modifications may be made by those skilled in the art without deviating from the spirit of the disclosure. Hence, the disclosure is not limited to the embodiments provided hereinafter.

The disclosure is detailed in conjunction with schematic diagrams. Sectional views illustrating structures of devices may be partially scaled up for convenience in detailed the embodiments of the disclosure. The schematic diagrams are only exemplary and should not limit the disclosure. A three-dimensional spatial size including length, width and depth should be considered in practice.

Some embodiments are detailed as follows.

Figure 1A:
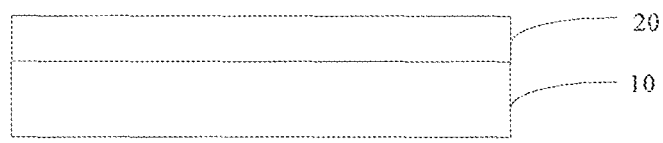
FIGS. 1a-1c illustrate a manufacturing process for a conventional flexible display motherboard.
Figure 1B:
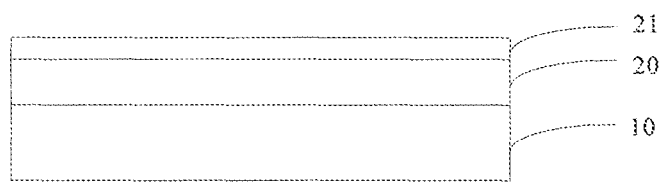
Figure 1C:
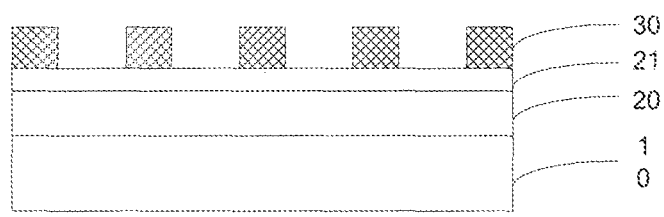
Figure 2:
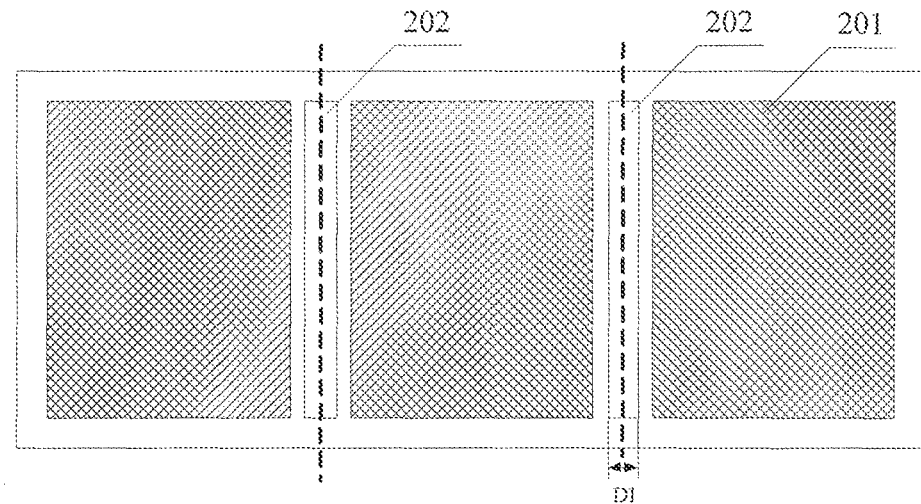
FIG. 2 illustrates an arrangement of first grooves provided between groups of flexible display units according to a first embodiment of the disclosure, where each group includes one flexible display unit.

A flexible display motherboard is provided according to the embodiment. On the flexible display motherboard, first grooves are provided between flexible display units. The first grooves according to the first embodiment are shown in FIG. 2. The flexible display motherboard includes a plurality of flexible display units 201. The flexible display units 201 are divided into several groups (as shown in FIG. 2, the flexible display unit between two dashed lines forms one group). Each group includes at least one flexible display unit 201. First grooves 202 are provided between the respective groups of flexible display units. The width D1 of the first grooves 202 ranges from 15 μm to 20 μm. Here, description is made with a case that each group includes one flexible display unit 201.

Figure 3:
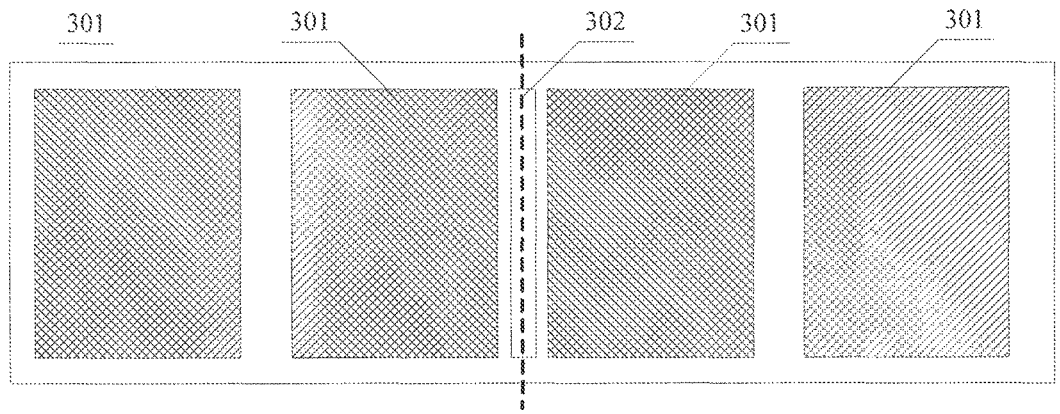
FIG. 3 illustrates another arrangement of first grooves provided between groups of flexible display units according to an embodiment of the disclosure, where each group includes two flexible display units.
Figure 4:
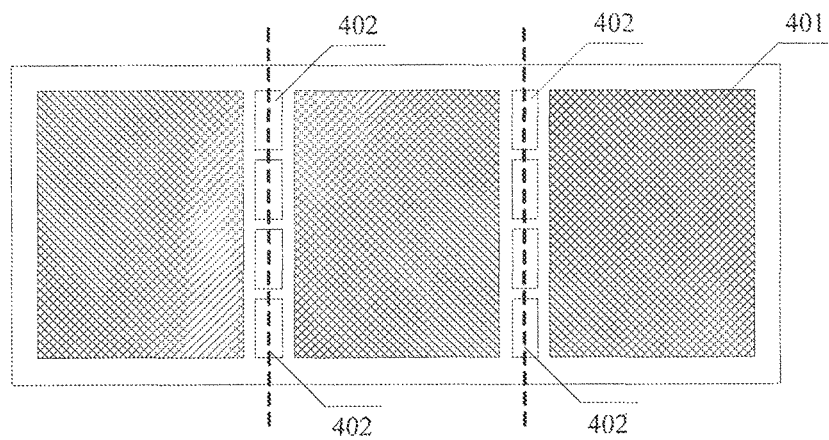
FIG. 4 illustrates further another arrangement of first grooves according to an embodiment of the disclosure.

In another case, each group may include a plurality of flexible display units. Another arrangement of first grooves between groups of flexible display units is shown in FIG. 3. As illustrated in FIG. 3, each group of flexible display units includes two flexible display units 301, and first grooves 302 are provided between the groups of flexible display units. Moreover, as illustrated in FIG. 2 and FIG. 3, the first grooves provided between the groups of flexible display units may be continuous; or a plurality of discontinuous grooves may be provided. Further another arrangement of first grooves is shown in FIG. 4. As shown in FIG. 4, each group of flexible display units includes one flexible display unit 401, and a plurality of discontinuous first grooves 402 are provided between the groups of flexible display units.

Figure 5:
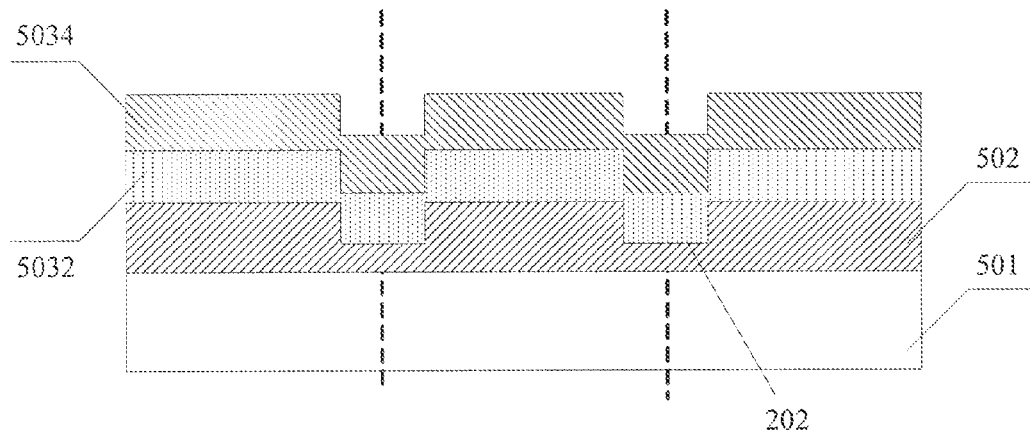
FIGS. 5-7 illustrate the first grooves according to the first embodiment of the disclosure.

FIG. 5 illustrates the first grooves according to the first embodiment of the disclosure, formed by etching a buffer layer. As shown in FIG. 5, the flexible display motherboard according to the embodiment includes a flexible substrate 501, a buffer layer 502 located on a surface of the flexible substrate 501, and a display device located on a surface of the buffer layer 502. The display device includes gate lines, a gate insulating layer 5032, data lines and a passivation layer 5034. The first grooves 202 are formed by etching at least one of the buffer layer 502, the gate insulating layer 5032 and the passivation layer 5034. In the case that the depth of the first grooves 202 is less than the thickness of the buffer layer 502, the difference between the depth of the first grooves 202 and the thickness of the buffer layer 502 ranges from 0.05 μm to 0.1 μm; here the thickness of the buffer layer 502 ranges from 0.2 μm to 0.3 μm.

As illustrated in FIG. 5, the first grooves 202 are formed by etching only the buffer layer 502. Alternatively, the first grooves 202 may be formed by etching the gate insulating layer 5032 or the passivation layer 5034.

Figure 6:
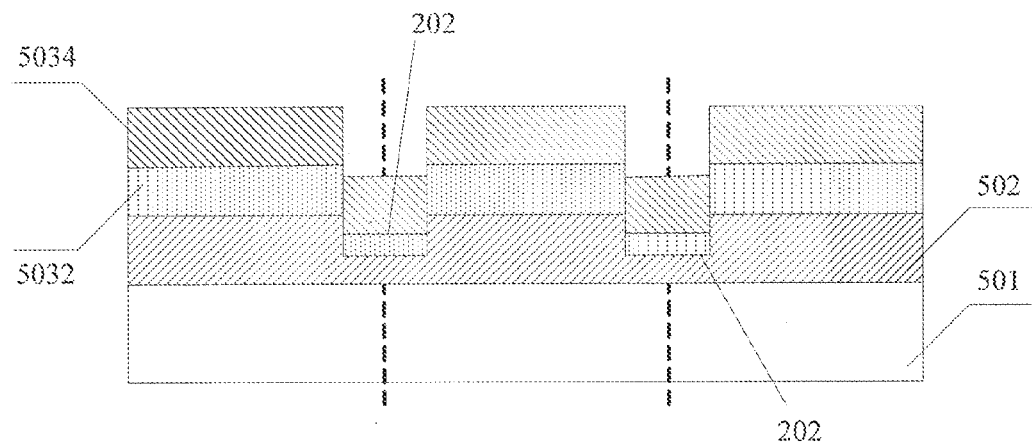

Alternatively, first grooves 202 may be formed by etching any two of the buffer layer 502, the gate insulating layer 5032 and the passivation layer 5034. As illustrated in FIG. 6, the first grooves 202 according to the first embodiment of the disclosure are formed by etching the buffer layer and the gate insulating layer.

Figure 7:
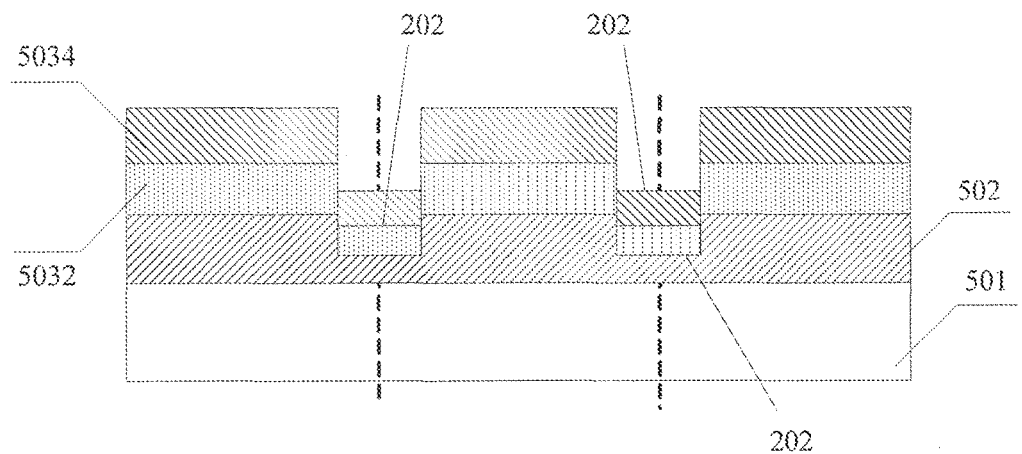

Alternatively, the first grooves 202 may be formed by etching the buffer layer 502, the gate insulating layer 5032 and the passivation layer 5034. As illustrated in FIG. 7, the first grooves 202 according to the first embodiment of the disclosure are formed by etching the buffer layer 502, the gate insulating layer 5032 and the passivation layer 5034.

As illustrated in FIGS. 5-7, although the first grooves formed by etching a lower layer may be filled up during making an upper layer, a function of the first grooves is not influenced. For example, the first grooves 202 formed by etching the buffer layer 502 may be filled up during making the gate insulating layer 5032 and the passivation layer 5034. The inward shrinkage stress within the buffer layer 502 is released via the first grooves 202. Moreover, since both the gate insulating layer 5032 and the passivation layer 5034 are discontinuous at positions corresponding to the first grooves 202, inward shrinkage stresses within upper layers such as the gate insulating layer 5032 are also released.

According to the embodiment, the flexible substrate 501 is a plastic substrate, and the buffer layer 502 is a silicon oxide thin film or a silicon oxide-silicon nitride thin film. Preferably, the first grooves 202 are formed by etching the buffer layer 502. In the case that the first grooves 202 are formed by etching the buffer layer 502, the depth of the first grooves 202 is equal to or less than the thickness of the buffer layer 502.

With the depth of the first grooves 202 less than the thickness of the buffer layer 502, the inward shrinkage stress within the buffer layer 502 can be reduced while a moisture isolation function of the buffer layer is not impaired. Alternatively, according to other embodiments, the depth of the first grooves 202 may be equal to the thickness of the buffer layer 502. In this case, the first grooves 202 are holes penetrating through the buffer layer 502, and the inward shrinkage stress within the buffer layer 502 may be reduced because of the holes.

During manufacturing the flexible display motherboard, since film layers such as the buffer layer are formed on the surface of the flexible substrate under high temperature, the film layers may be shrank inwardly after being cooled and dried, resulting in a warpage of the flexible substrate. Accordingly, devices on the flexible substrate are deformed, thereby affecting performance of the display device and a display apparatus. With the flexible display motherboard according to the embodiment, the plurality of flexible display units on the flexible display motherboard are divided into several groups, and the first grooves are provided between the groups of flexible display units. Since the first grooves are formed by etching at least one of the buffer layer, the gate insulating layer and the passivation layer, the inward shrinkage stress within the at least one of the buffer layer, the gate insulating layer and the passivation layer may be reduced, and accordingly, the inward shrinkage stress within the flexible display motherboard is reduced. Moreover, since the first grooves are provided between the groups of flexible display units, it is equivalent that a whole film layer is divided into a plurality of regions by the first grooves, thereby effectively dispersing the inward shrinkage stresses within the respective regions of the flexible display motherboard. Hence, a deformation of the flexible substrate and the display device, which may affect the manufacture of the flexible display motherboard and may result in a failure of the flexible display apparatus, is avoided.

Figure 8:
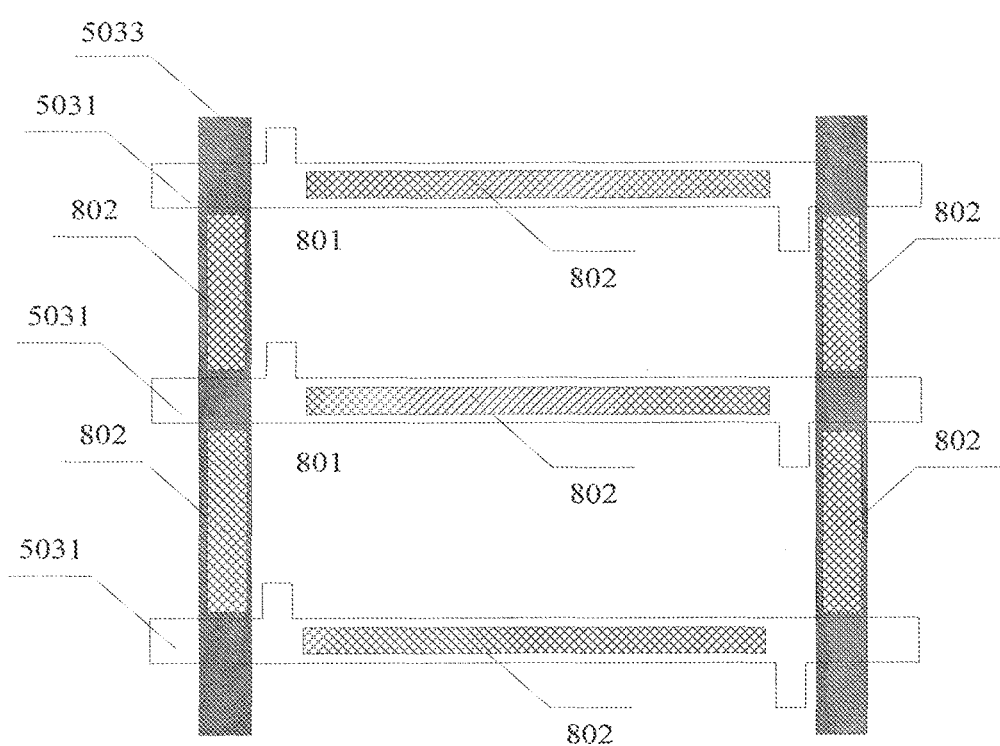
FIG. 8 illustrates the second grooves according to the second embodiment of the disclosure.

A flexible display motherboard is provided according to the embodiment. Similar to the first embodiment, the flexible display motherboard according to the embodiment includes a plurality of flexible display units which are divided into several groups, and first grooves are provided between the groups of flexible display units. Different from the first embodiment, the flexible display motherboard according to the embodiment further includes second grooves. FIG. 8 illustrates the second grooves according to the second embodiment of the disclosure, which are provided between respective pixel units. As illustrated in FIG. 8, a plurality of pixel units 801 are defined by intersections of gate lines 5031 and data lines 5033. The plurality of pixel units 801 are divided into several groups. Each group includes at least one pixel unit 801. Second grooves 802 are provided between the respective groups of pixel units 801. The second grooves 802 are formed by etching at least one of a buffer layer 502, a gate insulating layer 5032 and a passivation layer 5034. The second grooves 802 may be located in regions corresponding to the gate lines 5031, or may be located in regions corresponding to the data lines 5033. However, the second grooves 802 may not be located in regions where the gate lines 5031 intersect with the data lines 5033.

Figure 9:
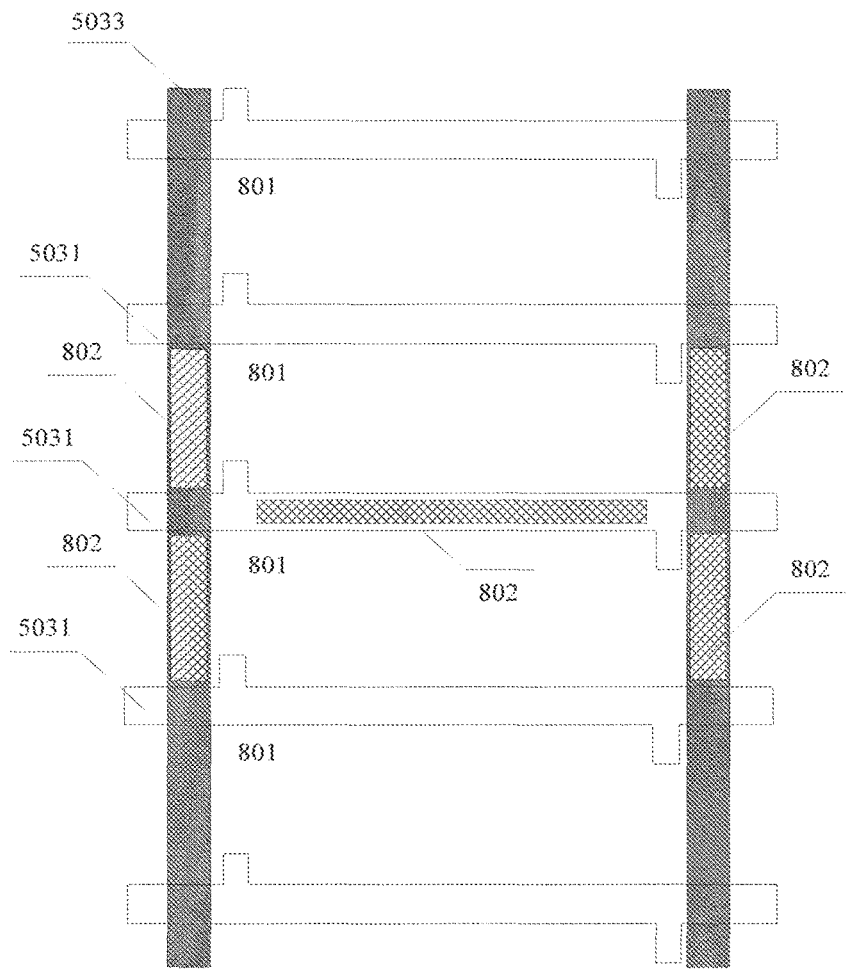
FIGS. 9-12 illustrate another arrangement of the second grooves according to the second embodiment of the disclosure.

Alternatively, each group may include a plurality of pixel units. FIG. 9 illustrates another arrangement of the second grooves according to the second embodiment of the disclosure. As illustrated in FIG. 9, each group of pixel units includes two pixel units 801, and the second grooves 802 are provided between the respective groups of pixel units. Similarly, the second grooves 802 may be located in regions corresponding to the gate lines 5031, or may be located in regions corresponding to the data lines 5033. However, the second grooves 802 may not be located in regions where the gate lines 5031 intersect with the data lines 5033.

Figure 10:
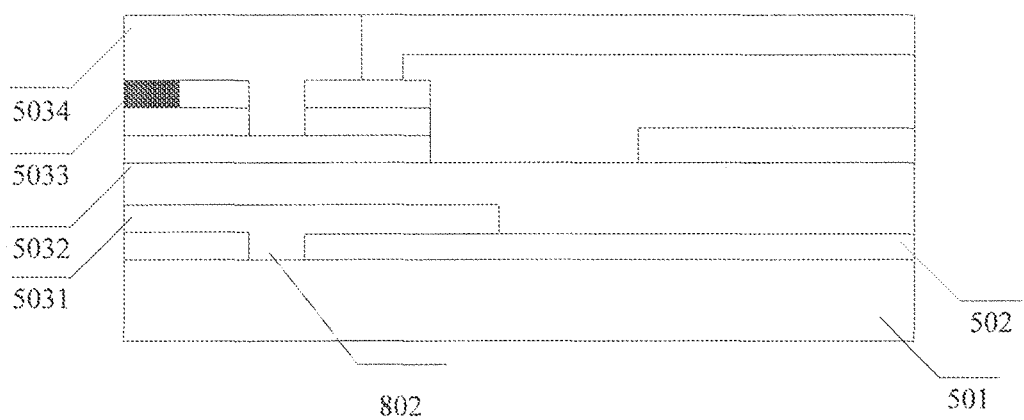

The second grooves 802 may be formed by etching any one of the buffer layer 502, the gate insulating layer 5032 and the passivation layer 5034. As illustrated in FIG. 10, the second grooves 802 according to the second embodiment of the disclosure are formed by etching the buffer layer 502.

Figure 11:
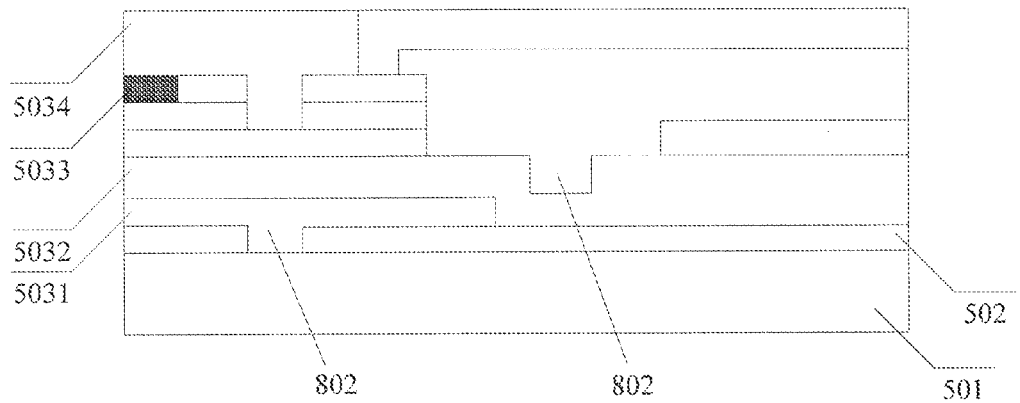

Alternatively, the second grooves 802 may be formed by etching any two layers of the buffer layer 502, the gate insulating layer 5032 and the passivation layer 5034. As illustrated in FIG. 11, the second grooves 802 according to the second embodiment of the disclosure are formed by etching the buffer layer 502 and the gate insulating layer 5032.

Figure 12:
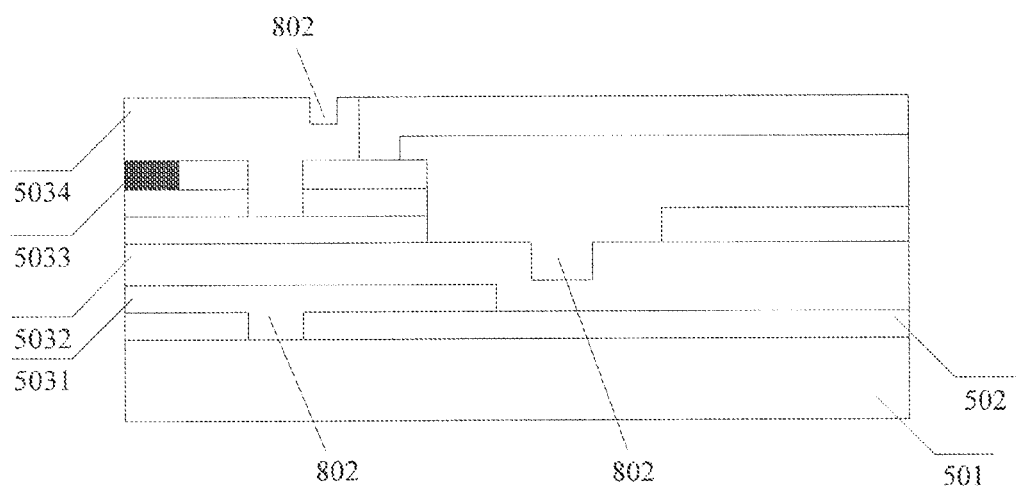

Alternatively, the second grooves 802 may be formed by etching the buffer layer 502, the gate insulating layer 5032 and the passivation layer 5034. As illustrated in FIG. 12, the second grooves according to the second embodiment of the disclosure are formed by etching the buffer layer 502, the gate insulating layer 5032 and the passivation layer 5034.

The second grooves 802 are not located in the regions where the gate lines 5031 intersect with the date lines 5033. In the case that the second grooves 802 are formed by etching the buffer layer 502, the depth of the second grooves 802 is less than or equal to the thickness of the buffer layer 502. In the case that the depth of the second grooves 802 is less than the thickness of the buffer layer 502, the difference between the depth of the second grooves 802 and the thickness of the buffer layer 502 ranges from 0.05 μm to 0.1 μm.

During manufacturing the flexible display motherboard, since film layers such as the buffer layer are formed under high temperature, the film layers may be shrank inwardly after being cooled and dried, resulting in a warpage of the flexible substrate. Accordingly, devices on the flexible substrate are deformed, thereby affecting performance of a display device and a display apparatus. With the flexible display motherboard according to the embodiment, the plurality of flexible display units on the flexible display motherboard are divided into several groups, and the first grooves are provided between the groups of flexible display units. Since the first grooves are formed by etching at least one of the buffer layer, the gate insulating layer and the passivation layer, the inward shrinkage stress within the at least one of the buffer layer, the gate insulating layer and the passivation layer may be reduced, and accordingly, the inward shrinkage stress within the flexible display motherboard is reduced. Moreover, since the first grooves are provided between the groups of flexible display units, it is equivalent that a whole film layer is divided into a plurality of regions by the first grooves, thereby effectively dispersing the inward shrinkage stresses within the respective regions of the flexible display motherboard.

Furthermore, with the flexible display motherboard according to the embodiment, the plurality of pixel units defined by the intersections of the gate lines and the data lines are divided into several groups, and the second grooves are provided between the groups of pixel units. The second grooves are formed by etching at least one of the buffer layer, the gate insulating layer and the passivation layer. The flexible display motherboard may be divided into small discontinuous units by the second grooves, to further release and disperse the inward shrinkage stress within the flexible display motherboard. Therefore, a deformation of a flexible substrate and the display device, which may affect the manufacture of the flexible display motherboard and may result in a failure of the flexible display apparatus, is avoided.

Figure 13:
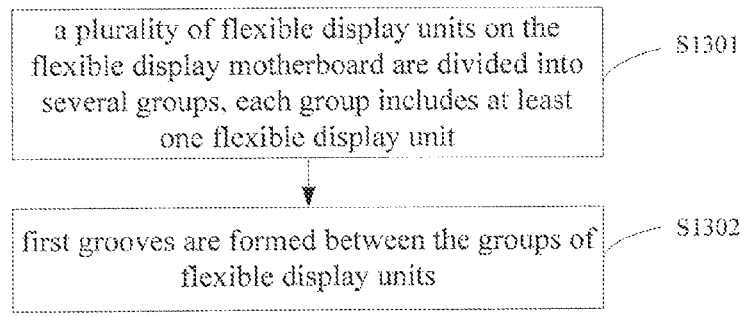
FIG. 13 is a flowchart of the method for manufacturing the flexible display motherboard according to the third embodiment of the disclosure.

A method for manufacturing a flexible display motherboard is provided according to the embodiment. FIG. 13 is a flowchart of the method for manufacturing the flexible display motherboard according to the third embodiment of the disclosure. The method includes the following steps S1301 to S1302.

In the step S1301, a plurality of flexible display units on the flexible display motherboard are divided into several groups. Each group includes at least one flexible display unit.

To manufacture the flexible display units, firstly, a plurality of flexible display units are simultaneously made on a big substrate, i.e., the flexible display motherboard including the plurality of flexible display units is manufactured; and then the manufactured flexible display motherboard is diced into individual flexible display units. Subsequent processes for manufacturing a flexible display apparatus may be further performed.

According to the embodiment, firstly, the plurality of flexible display units on the flexible display motherboard are divided into several groups. Each group includes at least one of the plurality of flexible display units.

In the step S1302, first grooves are formed between the groups of flexible display units.

During manufacturing the flexible display motherboard, the first grooves are provided between the groups of flexible display units after the flexible display units are divided into groups. The first grooves 202 are formed by etching at least one of a buffer layer, a gate insulating layer and a passivation layer.

Figure 14:
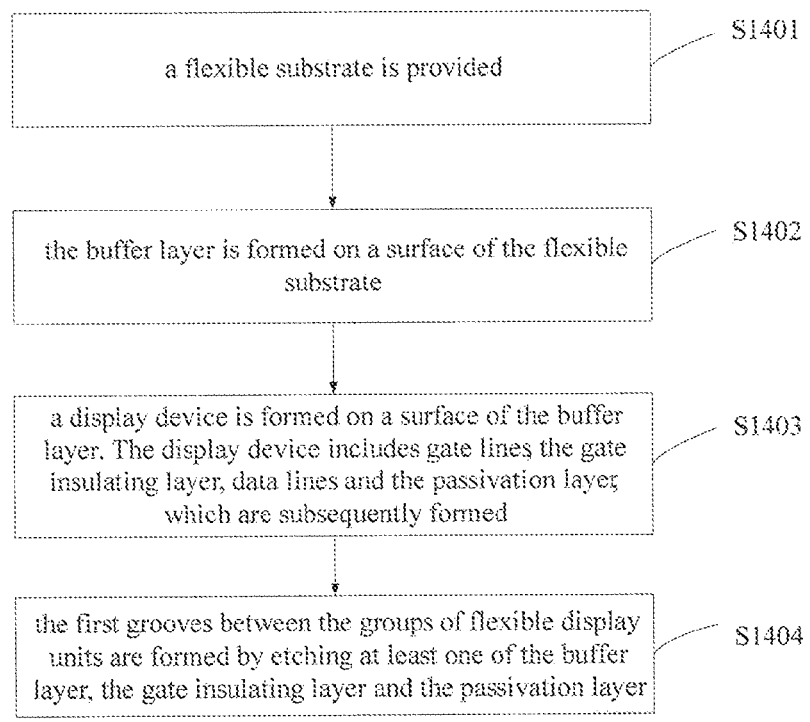
FIG. 14 is a flowchart of an approach for forming the first grooves between the groups of flexible display units.

FIG. 14 is a flowchart of an approach for forming the first grooves between the groups of flexible display units. The method includes the following steps S1401 to S1404.

In the step S1401, a flexible substrate is provided.

The flexible substrate may be provided by being coated on a glass substrate or by being adhered to the glass substrate via an organic adhesive. Generally, the flexible substrate is a plastic substrate.

In the step S1402, the buffer layer is formed on a surface of the flexible substrate.

After the flexible substrate is formed, the buffer layer is formed on a surface of the flexible substrate. The buffer layer covers the surface of the flexible substrate and may isolate moisture during subsequent processes performed under high temperature. Preferably, the buffer layer is a silicon oxide thin film or a silicon oxide-silicon nitride thin film. The buffer layer may be formed through processes such as sputtering or chemical vapor deposition.

In the step S1403, a display device is formed on a surface of the buffer layer. The display device includes gate lines, the gate insulating layer, data lines and the passivation layer, which are subsequently formed.

After the buffer layer is formed, the display device is required to be formed on the surface of the buffer layer to display images. The display device includes the gate lines, the gate insulating layer, the data lines and the passivation layer, which are formed subsequently and arranged upwardly one by one. A plurality of pixel units may be defined by intersections of the gate lines and the data lines.

The flexible display motherboard includes a plurality of thin films such as the buffer layer, the gate insulating layer and the passivation layer. Inward shrinkage stress may be generated within the flexible display motherboard during forming these thin films. The inward shrinkage stress may increase as the thickness of the film layers and the size of the film layers increase. The inward shrinkage stress may result in an inward shrink and a warpage of the flexible substrate, thereby influencing subsequent processes and performance of the flexible display apparatus.

In the step S1404, the first grooves between the groups of flexible display units are formed by etching at least one of the buffer layer, the gate insulating layer and the passivation layer.

Based on the above, during manufacturing the flexible display motherboard according to the embodiment, at least one of the buffer layer, the gate insulating layer and the passivation layer is etched to form the first grooves. The inward shrinkage stress within the thin film(s) is reduced, and accordingly, the stress within the flexible display motherboard is reduced, thereby improving performance of the flexible display apparatus.

The first grooves are formed through a photolithography process. For example, a photoresist layer is formed on the buffer layer; a mask is used to perform exposure and development on the photoresist layer, to obtain a patterned photoresist layer; and then the patterned photoresist layer is used as a mask and the buffer layer is etched with a dry etching process to form the first grooves.

According to other embodiments of the disclosure, second grooves may be further formed after formation of the first grooves between the groups of flexible display units, to further release the inward shrinkage stress within the flexible display motherboard.

A plurality of pixel units defined by intersections of the gate lines and the data lines are divided into several groups, and each group includes at least one of the plurality of pixel units.

The display device formed on the surface of the buffer layer includes the gate lines, the gate insulating layer, the data lines and the passivation layer. The plurality of pixel units are defined by the intersections of the gate lines and the data lines. According to the embodiment, the plurality of pixel units defined by the intersections of the gate lines and the data lines are divided into several groups, and each group includes at least one of the plurality of pixel units.

After the pixel units are divided into groups, the second grooves are formed between the groups of pixel units.

During manufacturing the flexible display motherboard, at least one of the buffer layer, the gate insulating layer and the passivation layer is etched to form the second grooves. In the case that at least part of each second groove is formed by etching the gate insulating layer, the gate insulating layer is partially etched after a formation of the gate insulating layer. In the case that the second grooves are formed by etching the buffer layer, the buffer layer is etched after a formation of the buffer layer. The second grooves may be etched through same processes as the first grooves, which are not repeated herein.

In the method for manufacturing the flexible display motherboard according to the embodiment, the first grooves between the groups of flexible display units are formed by etching at least one of the buffer layer, the gate insulating layer and the passivation layer, and the second grooves between the groups of pixel units are formed by etching at least one of the buffer layer, the gate insulating layer and the passivation layer. Therefore, the inward shrinkage stress within the flexible display motherboard may be released via the first grooves and the second grooves. Therefore, an accumulation of the stress, which may affect the manufacture of the flexible display motherboard and may result in a failure of the flexible display apparatus, is avoided effectively.

Figure 15:
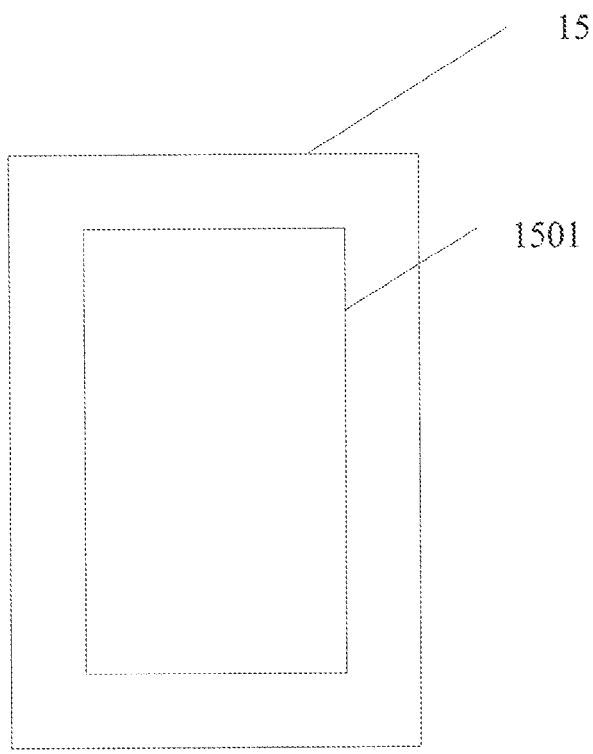
FIG. 15 illustrates a flexible display apparatus.

A flexible display apparatus is provided according to the embodiment. As shown in FIG. 15, the flexible display apparatus 15 includes a flexible display unit 1501 obtained by dicing the flexible display motherboard according to the above embodiments. During manufacturing the flexible display units, the inward shrinkage stress within the flexible display motherboard is released via the first grooves and the second grooves, thereby avoiding a failure of the flexible display apparatus and improving performance of the flexible display apparatus 15.

The embodiments according to the disclosure are described progressively. Differences from other embodiments are emphasized in the description of each embodiment. Same or similar parts between the embodiments may be referred to each other. Since the apparatus disclosed herein is corresponding to the methods disclosed in the specification, the description of the apparatus is brief, and relative parts may be referred to the description of the methods.

With the above description of the disclosed embodiments, the disclosure may be implemented or used by those skilled in the art. Various modifications to the embodiments are obvious to those skilled in the art. The general principle defined herein may be achieved with other embodiments without departing from the scope and the spirit of the disclosure. Therefore, the disclosure is not limited to the embodiments disclosed herein, and should claim a widest scope in accordance with the principle and novel features disclosed herein.

What is claimed is:

1. A flexible display motherboard, comprising:
   a flexible substrate;
   a first layer on the top surface of the flexible substrate;
   a second layer on the top surface of the first layer;
   a third layer on the top surface of the second layer, wherein a plurality of flexible display units are defined on the flexible display motherboard, and
   a first type of grooves are formed between two adjacent flexible display units of the plurality of flexible display units, and the first type of grooves each is displaced through at least the first layer and the second layer,
   wherein the first type of grooves in the first layer includes materials of the first layer, and the first type of grooves in the first layer is further filled with materials from the second layer, and
   wherein the first type of grooves in the second layer includes materials of the third layer.

2. The flexible display motherboard according to claim 1, wherein the first layer and the second layer are layers selected from any of a buffer layer, a gate insulating layer, and a passivation layer.

3. The flexible display motherboard according to claim 2, wherein the buffer layer comprises at least one of a silicon oxide thin film and a silicon oxide-silicon nitride thin film.

4. The flexible display motherboard according to claim 2, wherein the flexible substrate comprises plastic.

5. The flexible display motherboard according to claim 2, wherein the first type of grooves are formed by etching the buffer layer, and wherein a depth of the first grooves is equal to or less than a thickness of the buffer layer.

6. The flexible display motherboard according to claim 5, wherein a difference between the depth of the plurality of first grooves and the thickness of the buffer layer is between about 0.05 µm and about 0.1 µm.

7. The flexible display motherboard according to claim 1, wherein a width of the plurality of first grooves is between about 15 µm and about 20 µm.

8. The flexible display motherboard according to claim 1, further comprising a second type of grooves overlapping with the gate lines and the data lines of the display units.

9. The flexible display motherboard according to claim 8, wherein the second type of grooves are formed in at least one of the buffer layer, the gate insulating layer, and the passivation layer.

10. The flexible display motherboard according to claim 9, wherein the second type of grooves is formed in the gate insulating layer, and the second type of grooves are not provided in regions where the gate lines intersect with the data lines.

11. The flexible display motherboard according to claim 9, wherein the second type of grooves are formed in the buffer layer, and a depth of the second grooves is equal to or less than a thickness of the buffer layer.

12. The flexible display motherboard according to claim 11, wherein a difference between the depth of the second grooves and the thickness of the buffer layer is between about 0.05 µm and about 0.1 µm.

13. A flexible display apparatus, comprising:
   a plurality of flexible display units diced from a flexible display motherboard, wherein the flexible display motherboard comprises:
   a flexible substrate;
   a first layer on the top surface of the flexible substrate;
   a second layer on the top surface of the first layer;
   a third layer on the top surface of the second layer, wherein a plurality of flexible display units are defined on the flexible display motherboard, and
   a first type of grooves are formed between two adjacent flexible display units of the plurality of flexible display units, and the first type of grooves each is displaced through at least the first layer and the second layer,
   wherein the first type of grooves in the first layer includes materials of the first layer, and the first type of grooves in the first layer is further filled with materials from the second layer; and
   wherein the first type of grooves in the second layer includes materials of the third layer.

14. A method of manufacturing a flexible display motherboard, the method comprising:
   forming a flexible substrate;
   forming a first layer on the top surface of the flexible substrate;
   forming a second layer on the top surface of the first layer; and
   forming a third layer on the top surface of the second layer,
   wherein a plurality of flexible display units are defined on the flexible display motherboard,
   wherein a first type of grooves are formed between two flexible display units of the plurality of flexible display units, and the first type of grooves each is displaced through at least the first layer and the second layer,
   wherein the first type of grooves in the first layer includes materials of the first layer, and the first type of grooves in the first layer is further filled with materials from the second layer, and
   wherein the first type of grooves in the second layer includes materials of the third layer.

15. The method according to claim 14, wherein the first layer and the second layer are layers selected from any of a buffer layer, a gate insulating layer, and a passivation layer.

16. The method according to claim 15, wherein the plurality of flexible display units comprises a first group and a second group of pixel units, wherein the first and second groups of pixel units are defined by the gate lines and data lines, wherein the method further comprising:
   forming a second types of grooves between the first group and the second group of pixel units.

17. The method according to claim 16, wherein forming the second type of grooves comprises:
   etching at least one of the buffer layer, the gate insulating layer, and the passivation layer.

* * * * *